(12) United States Patent
Dellas et al.

(10) Patent No.: US 12,417,914 B2
(45) Date of Patent: Sep. 16, 2025

(54) TECHNIQUE FOR GaN EPITAXY ON INSULATING SUBSTRATES

(71) Applicant: TEXAS INSTRUMENTS INCORPORATED, Dallas, TX (US)

(72) Inventors: Nicholas S. Dellas, Dallas, TX (US); Scott Robert Summerfelt, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 488 days.

(21) Appl. No.: 17/588,589

(22) Filed: Jan. 31, 2022

(65) Prior Publication Data

US 2022/0246423 A1 Aug. 4, 2022

Related U.S. Application Data

(60) Provisional application No. 63/145,008, filed on Feb. 3, 2021.

(51) Int. Cl.
*H01L 21/02* (2006.01)
*H01L 21/304* (2006.01)
*H01L 21/324* (2006.01)

(52) U.S. Cl.
CPC .... *H01L 21/0254* (2013.01); *H01L 21/02389* (2013.01); *H01L 21/304* (2013.01); *H01L 21/3245* (2013.01)

(58) Field of Classification Search
CPC ........... H01L 21/0254; H01L 21/02389; H01L 21/304; H01L 21/3245; H01L 21/2654; H01L 21/2007; H01L 21/02002
See application file for complete search history.

(56) References Cited

U.S. PATENT DOCUMENTS

| | | | | |
|---|---|---|---|---|
| 9,650,723 | B1* | 5/2017 | D'Evelyn | C30B 9/00 |
| 2006/0246614 | A1* | 11/2006 | Suh | H01L 21/02658 438/22 |
| 2012/0074424 | A1* | 3/2012 | Lee | H01L 29/7787 257/E33.049 |
| 2017/0186913 | A1* | 6/2017 | Brandes | H01L 29/66462 |
| 2021/0296122 | A1* | 9/2021 | Adusumilli | H01L 21/02639 |

* cited by examiner

*Primary Examiner* — Ajay Ojha
*Assistant Examiner* — Sandra Milena Rodriguez Villan
(74) *Attorney, Agent, or Firm* — Frank D. Cimino (57) ABSTRACT

A method includes depositing a first epitaxial layer of an aluminum gallium nitride (AlGaN) material onto a preliminary substrate and polishing the first layer's surface. Ions are implanted beneath the surface, which is bonded to a seed insulating substrate. Annealing is performed, resulting in second epitaxial layer on preliminary substrate and third epitaxial layer on seed insulating substrate. Third layer's surface is polished to obtain a seed wafer. In some implementations, a fourth epitaxial layer of a second AlGaN material is deposited onto surface of third layer. Fourth layer's surface is polished, and ions are implanted beneath the surface, which is bonded to a product insulating substrate. Annealing is performed, resulting in fifth epitaxial layer on seed insulating substrate and sixth epitaxial layer on product insulating substrate. The sixth layer can be used to obtain an AlGaN product, and the fifth layer can be reused to fabricate additional AlGaN products.

33 Claims, 9 Drawing Sheets

TECHNIQUE FOR GaN EPITAXY ON INSULATING SUBSTRATES

CROSS-REFERENCE TO RELATED APPLICATIONS

This application claims priority to U.S. Provisional Application No. 63/145,008, filed Feb. 3, 2021, which is hereby incorporated by reference.

BACKGROUND

Gallium nitride (GaN) devices have many advantages over silicon devices, including lower on-resistance, faster switching, lower power, and smaller area. GaN devices fabricated on insulating substrates such as polycrystalline aluminum nitride (p-AlN) wafers can surprisingly have many advantages over GaN devices fabricated on Si even lower dislocation densities. The reason for these advantages is that AlGaN is first epitaxially grown on advantageous substrate such as single crystal sapphire, GaN, SiC or AlN. Using a multiple step process an epitaxial AlGaN layers are removed from initial wafers using an ion-implantation layer splitting process using one or more substrate layers, with additional CMP and epitaxial AlGaN growth steps and film transfer steps to place the epitaxial layers on the advantageous polycrystalline AlN substrate. One advantage is GaN devices on insulating substrates do not experience vertical breakdown voltages or backgating, and multiple GaN devices can be integrated into a single semiconductor die, reducing the area occupied by the GaN devices. Another advantage is that the final epitaxial layer thicknesses can be reduced creating a potential cost advantage of requiring less deposition per device wafers In addition, some techniques for GaN epitaxy on insulating substrates require the epitaxial layer to be transferred to several different carrier wafers in order to obtain a surface of the epitaxial layer with the desired face. For example in one technique, a gallium-facing GaN epitaxial layer is grown on a first wafer and then bonded to a temporary wafer following chemical mechanical polishing (CMP) process. The GaN epitaxial layer is then separated from the first wafer to expose a nitride-facing surface, which undergoes CMP. The nitride-facing surface is then bonded to the final wafer, and the GaN epitaxial layer is separated from the temporary wafer to expose the gallium-facing surface, which undergoes CMP. Any problems or advantages introduced in the GaN epitaxial layer during the two bonding and separation steps, as well as the CMP steps, are carried through to the final GaN device.

SUMMARY

A method of epitaxial deposition includes depositing a first epitaxial layer of an aluminum gallium nitride (AlGaN) material onto a preliminary substrate and polishing the first layer's surface. Ions are implanted at a depth beneath the surface of the first layer, which is bonded to a seed insulating substrate. Annealing is performed, such that the first epitaxial layer divides into a second epitaxial layer on the preliminary substrate and a third epitaxial layer on the seed insulating substrate. The third layer's surface is polished to obtain a seed wafer. The preliminary substrate can be chosen based on the AlGaN material to reduce a dislocation density of the first epitaxial layer.

The depth beneath the surface of the first epitaxial layer can be chosen based on an intended thickness of the third epitaxial layer on the seed insulating substrate. In some implementations, the second epitaxial layer is removed from the preliminary substrate such that the preliminary substrate can be reused. The preliminary substrate can be a sapphire wafer. The surface of the first epitaxial layer can be gallium facing, and the surface of the third epitaxial layer is nitride facing, in some implementations. The seed insulating substrate can be a polycrystalline aluminum nitride wafer.

In some implementations, the AlGaN material is a first AlGaN material, and a fourth epitaxial layer of a second AlGaN material is deposited onto the surface of the third epitaxial layer on the seed insulating substrate. The fourth layer's surface is polished, and ions are implanted at a depth beneath the surface, which is bonded to a product insulating substrate. Annealing is performed, such that the fourth epitaxial layer divides into a fifth epitaxial layer on the seed insulating substrate and a sixth epitaxial layer on the product insulating substrate. The surface of the sixth epitaxial layer is polished, and a seventh epitaxial layer of a third AlGaN material is deposited onto the surface of the sixth epitaxial layer, resulting in an AlGaN product.

The product insulating substrate can be a same material as the seed insulating substrate. In some implementations, the depth beneath the surface of the fourth epitaxial layer is chosen based on an intended thickness of the sixth epitaxial layer. The surface of the third epitaxial layer is nitride facing, and the surface of the sixth epitaxial layer is gallium facing, in some implementations. The product insulating substrate is a polycrystalline aluminum nitride wafer in some implementations. The thickness of the fourth epitaxial layer can be chosen such that the fourth epitaxial layer can be used to fabricate a plurality of AlGaN products.

DETAILED DESCRIPTION

The same reference number is used in the drawings for the same or similar (either by function and/or structure) features.

The described processes for aluminum gallium nitride (AlGaN) epitaxy include fabricating a preliminary wafer, depositing a first AlGaN epitaxial layer on the preliminary wafer, and fabricating a number of AlGaN seed wafers using the preliminary wafer and the first AlGaN epitaxial layer. The preliminary wafer includes a preliminary insulating wafer and a base epitaxial layer. The preliminary wafer is fabricated using substrates such as single crystal sapphire, GaN, silicon carbide (SiC), aluminum nitride (AlN), and the like. The thickness of the first AlGaN epitaxial layer is chosen based on an intended thickness of a resulting AlGaN epitaxial layer a AlGaN seed wafer, an amount removed by the chemical-mechanical polishing (CMP) steps and a number of AlGaN seed wafers to be fabricated. The number of AlGaN seed wafers are fabricated while the thickness of the first AlGaN epitaxial layer is greater than the intended thickness of the resulting AlGaN epitaxial layer.

Fabricating an AlGaN seed wafer includes polishing a surface of the first AlGaN epitaxial layer and implanting ions at a depth beneath the surface of the first AlGaN epitaxial layer(s) based on the intended thickness of the resulting AlGaN epitaxial layer(s). The choice of ions, energy of ions, concentration of ions, wafer temperature of implantation are chosen based on the desired implementation. The surface of the first AlGaN epitaxial layer is bonded to a substrate that acts as the base of a seed wafer, such as polycrystalline AlN or SiC. After epitaxial deposition, CMP for planarization, bonding layer deposition, ion implantation and bonding to the seed insulating substrate, annealing is performed such that the first AlGaN epitaxial layer splits at the depth beneath the surface of the first AlGaN epitaxial layer. The resulting surfaces are smoothed and planarized using CMP.

The seed wafers can then be used as a seed layer for a second AlGaN epitaxial layer having a composition and thickness chosen based on the desired characteristics of the resulting AlGaN product wafers. The second epitaxial layer is deposited on the seed layer followed by CMP, bonding layer deposition, ion implantation, bonding to a product insulating wafer, and separation with annealing. Both wafer surfaces undergo CMP, resulting in a seed wafer with a thinner first AlGaN epitaxial layer and a product wafer which can be used for additional epitaxial deposition and patterning.

Figure 1A:
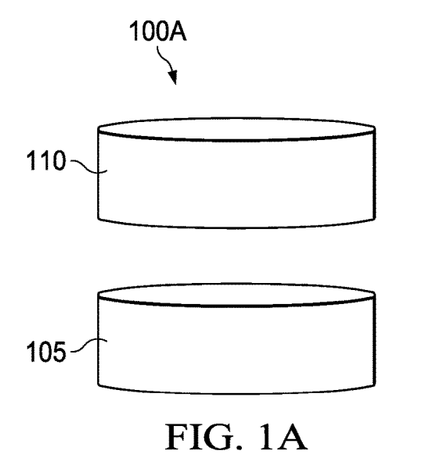
FIGS. 1A-E illustrate an example fabrication process for a seed wafer.

FIGS. 1A-E illustrate an example fabrication process 100 for a seed wafer. For ease of explanation, FIGS. 1A-E are described herein with reference to the example process 400 shown in FIG. 4 for fabricating a seed wafer. FIG. 1A illustrates a first step 100A in the process 100 and step 410 in process 400, in which an epitaxial layer 110 of a gallium nitride (AlGaN) material is deposited on a preliminary substrate 105. The seed epitaxial layer 110 can be a multilayer stack in some implementations. In some implementations, the epitaxial layer 110 is chosen to promote high-quality crystal growth and reduce the likelihood of defects such that the final product wafer performance and yield is increased. The preliminary substrate 105 is chosen to facilitate the growth of the epitaxial layer 110 such as a single crystal sapphire, GaN, SiC or AlN. The epitaxial AlGaN layer can be a complex multilayer chosen based on the preliminary substrate 105. For example, sapphire can be the preliminary substrate 105 and an initial AlN film is deposited, as well as one of more layers of AlGaN. In some implementations, less AlN is used the farther from the preliminary substrate 105.

Figure 4:
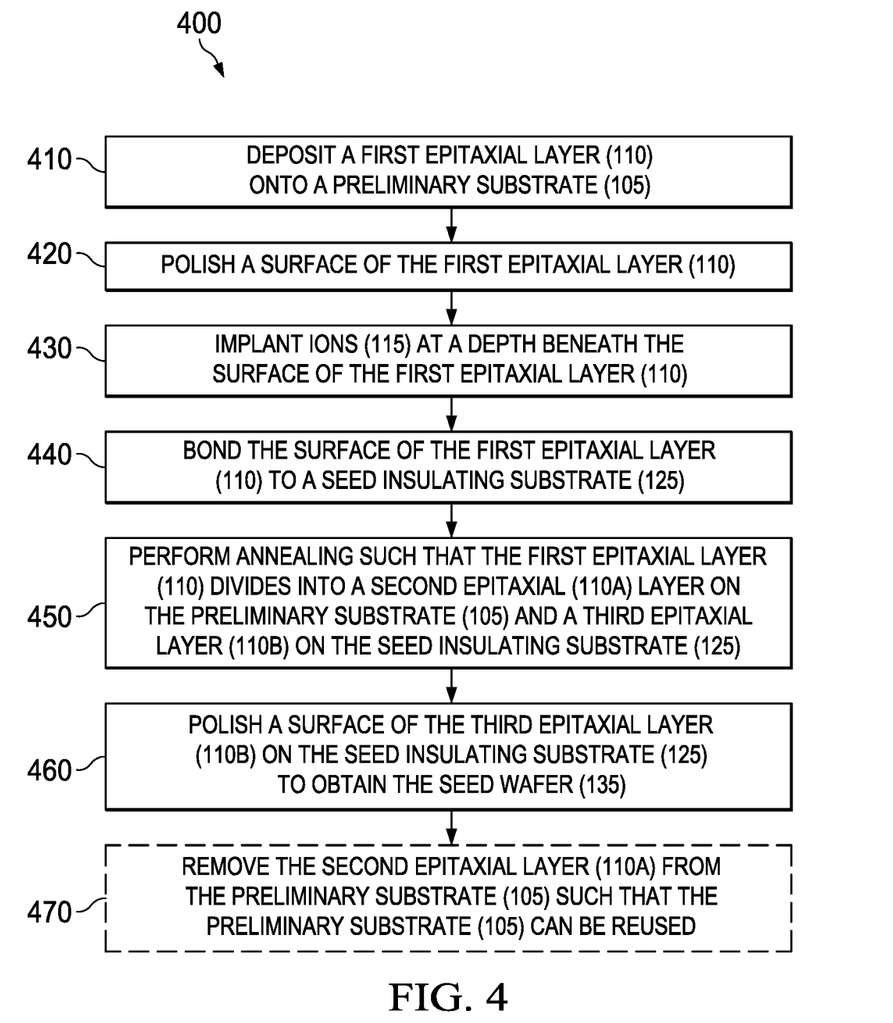
FIG. 4 shows, in flowchart form, an example process for fabricating a seed wafer.

Although the product wafers include high quality GaN layers, the AlGaN layers on the initial seed layer of preliminary substrate 105 need not be the high quality GaN included in the GaN device layers. The thickness of the epitaxial layer 110 can be chosen based on the particular specification for the resulting seed wafer, and may range from 2 to 12 micrometers (μm). For example, a sapphire preliminary substrate 105 may be chosen to promote the growth of a two μm gallium-facing (i.e., gallium polar) aluminum gallium nitride (AlGaN) epitaxial layer 110. The surface of the epitaxial layer 110 undergoes chemo-mechanical polishing (CMP) at step 420 of process 400 prior to bonding. The preliminary substrate 105 can be conditioned to promote seed layer growth. For example, a specific off-axis orientation can be chosen and/or controlled anneals performed to prepare the starting surface of preliminary substrate 105 for seed layer growth.

Figure 1B:
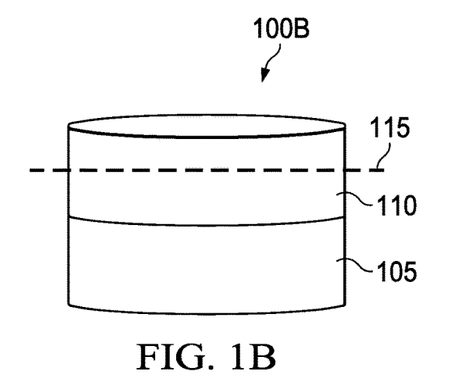

In a second step 100B shown in FIG. 1B and step 430 of process 400, ions 115 are implanted in the epitaxial layer 110 at a position chosen based on the desired thickness of the epitaxial layer 110 on the resulting seed wafer. The choice of ions, energy of ions, concentration of ions, wafer temperature of implantation and the like can be chosen based on the desired implementation. For example, hydrogen ions 115 may be implanted one half μm to one μm beneath a surface of the epitaxial layer 110.

Figure 1C:
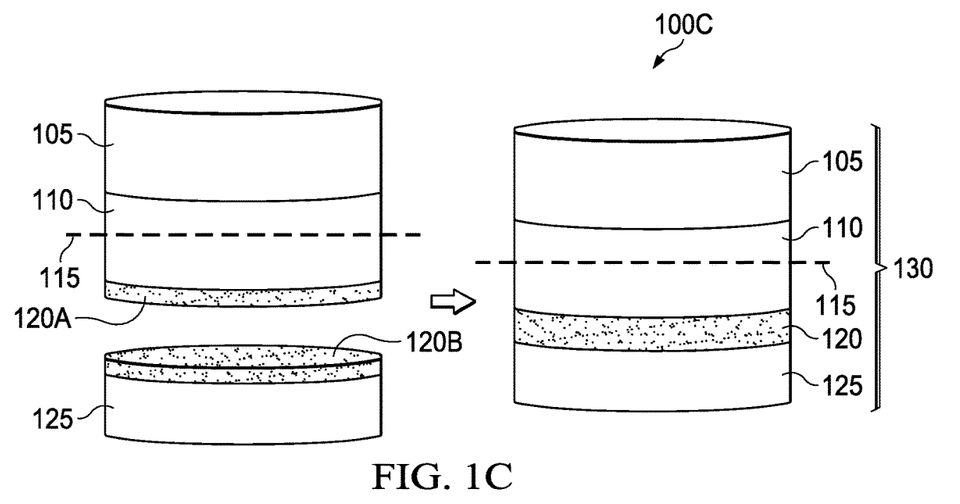

FIG. 1C illustrates a third step 100C, in which a layer 120A of a bonding agent is applied to the surface of the epitaxial layer 110 and/or a layer 120B of the bonding agent is applied to the surface of a seed wafer 125. The bonding agent can be silicon dioxide (SiO2). The seed wafer 125 can be dense and provide a void-free surface. In some implementations, a material of the seed wafer 125 is chosen to have thermal expansion mismatch relative to the epitaxial layers. For example, p-AlN has a thermal expansion mismatch similar to AlN, AlGaN, and GaN epitaxial layers. At step 440 of process 400, the seed wafer 125 is bonded to the epitaxial layer 110 by the layers 120A and/or 120B of the bonding agent to obtain a single stage 130 including the preliminary substrate 105, the epitaxial layer 110, the implanted ions 115, the bonding layer 120, and the seed wafer 125.

Figure 1D:
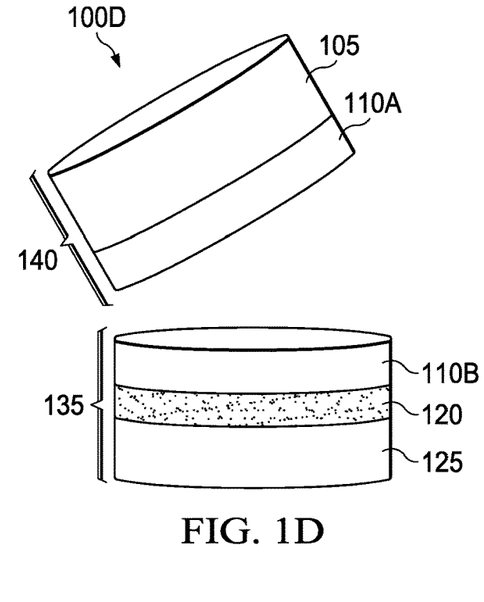
Figure 1E:
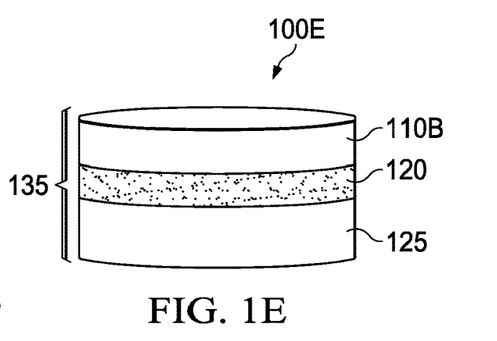

In step 100D illustrated in FIG. 1D and step 450 of process 400, the stage 130 is annealed such that the epitaxial layer 110 splits at the position of the implanted ions 115 to obtain two stages—a seed stage 135 and a preliminary stage 140. The preliminary stage 140 includes the preliminary substrate 105 and a partial epitaxial layer 110A from the epitaxial layer 110, and at step 470 of process 400, the preliminary stage 140 may be processed to remove the partial epitaxial layer 110A such that the preliminary substrate 105 can be reused. Alternatively, the surface of the partial epitaxial layer 110A can be smoothed using CMP and reused. The seed stage 135 includes the seed wafer 125, the bonding layer 120, and a partial epitaxial layer 110B from the epitaxial layer 110. In the example in which the hydrogen ions 115 are implanted one half μm beneath the surface of the epitaxial layer 110, the partial epitaxial layer 110B is one half μm thick. Both the preliminary stage 140 and the seed stage 135 can optionally be annealed to improve bonding or the quality of the epitaxial layers 110A and 110B.

In some implementations in which the epitaxial layer 110 is AlGaN, the partial epitaxial layer 110A may be gallium-facing, and the partial epitaxial layer 110B may be nitride-facing (i.e., nitride polar). The surface of the partial epitaxial layer 110B of the stage 135 undergoes CMP in step 100E illustrated in FIG. 1E and step 460 of process 400, resulting in the seed wafer 135 that can be used and reused in subsequent product fabrication to promote aligned deposition of other AlGaN materials.

Figure 2A:
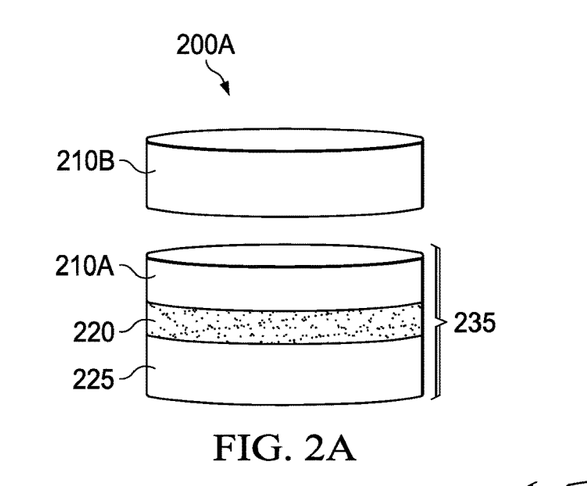
FIGS. 2A-E illustrate an example gallium nitride epitaxy process using the seed wafer shown in FIGS. 1A-E.

FIGS. 2A-E illustrate an example gallium nitride epitaxy process 200 using a seed wafer 135 from the process 100 shown in FIGS. 1A-E. For ease of illustration, FIGS. 2A-E are described herein with reference to the example process 500 shown in FIG. 5 for fabricating a product wafer. FIG. 2A illustrates a first step 200A in the process 200 and step 510 of process 500, in which an epitaxial layer 210B of an AlGaN material is deposited on the seed wafer 235. The seed wafer 235 is similar to the seed wafer 135 shown in FIG. 1E and includes the seed wafer 225, the bonding layer 220, and the partial epitaxial layer 210A. The AlGaN material in epitaxial layer 210B can be the same or different compared to the AlGaN material in epitaxial layer 210A of the seed wafer 235.

Figure 5:
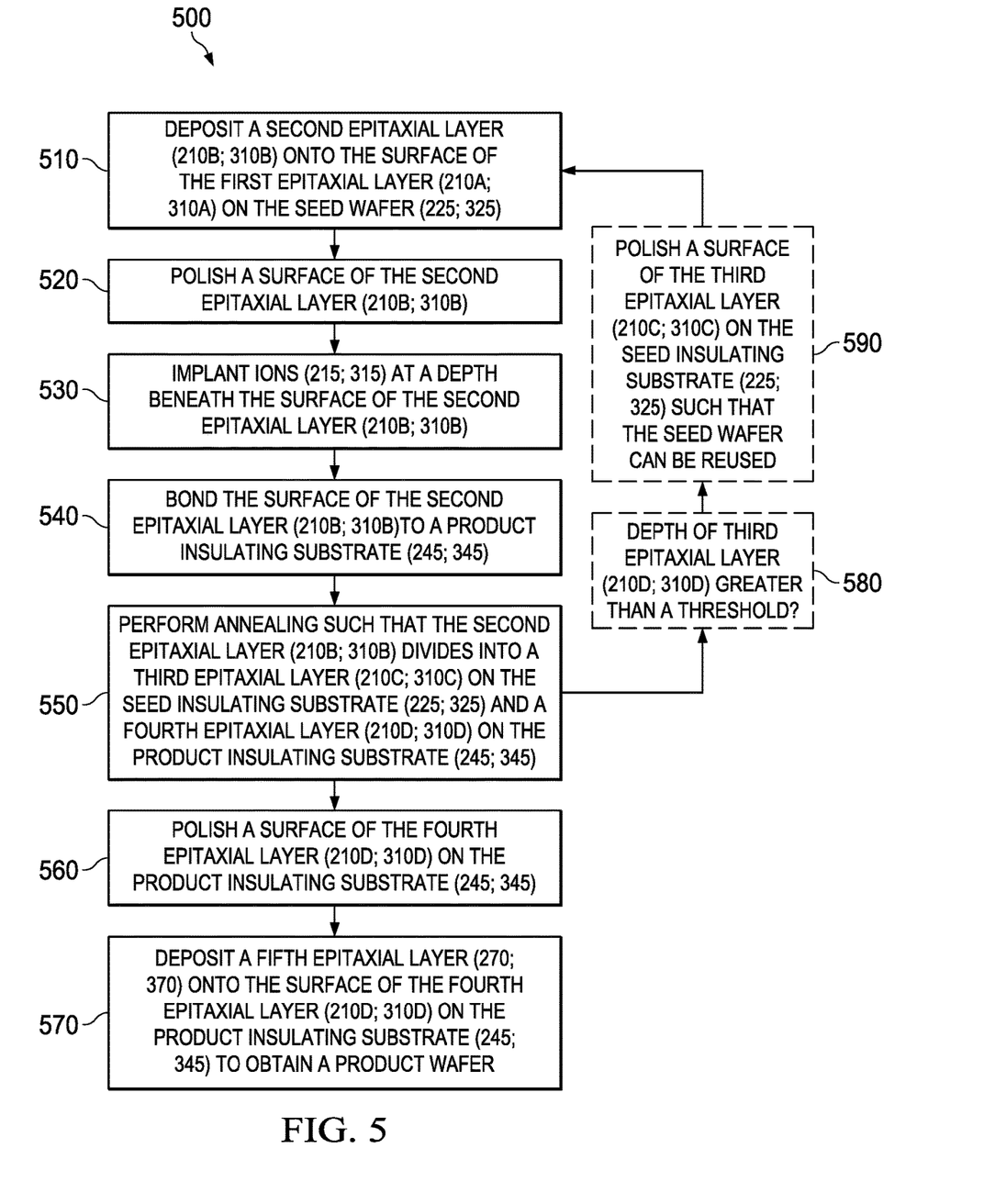
FIG. 5 shows, in flowchart form, an example process for fabricating a product wafer.

The thickness of the epitaxial layer 210B can be chosen based on the particular specifications for the resulting product, and may range from 0.5 to 10 μm. For example, a one μm AlGaN epitaxial layer 210B may be deposited on a nitride-facing AlGaN epitaxial layer 210A. The thickness of the epitaxial layer 210B can be thinner than a thickness of an epitaxial layer 210A deposited directly on the seed wafer 225. The surface of the epitaxial layer 210B undergoes CMP at step 520 of process 500.

Figure 2B:
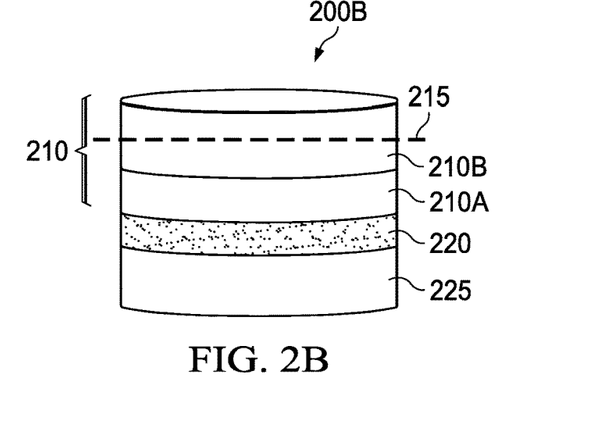
Figure 2C:
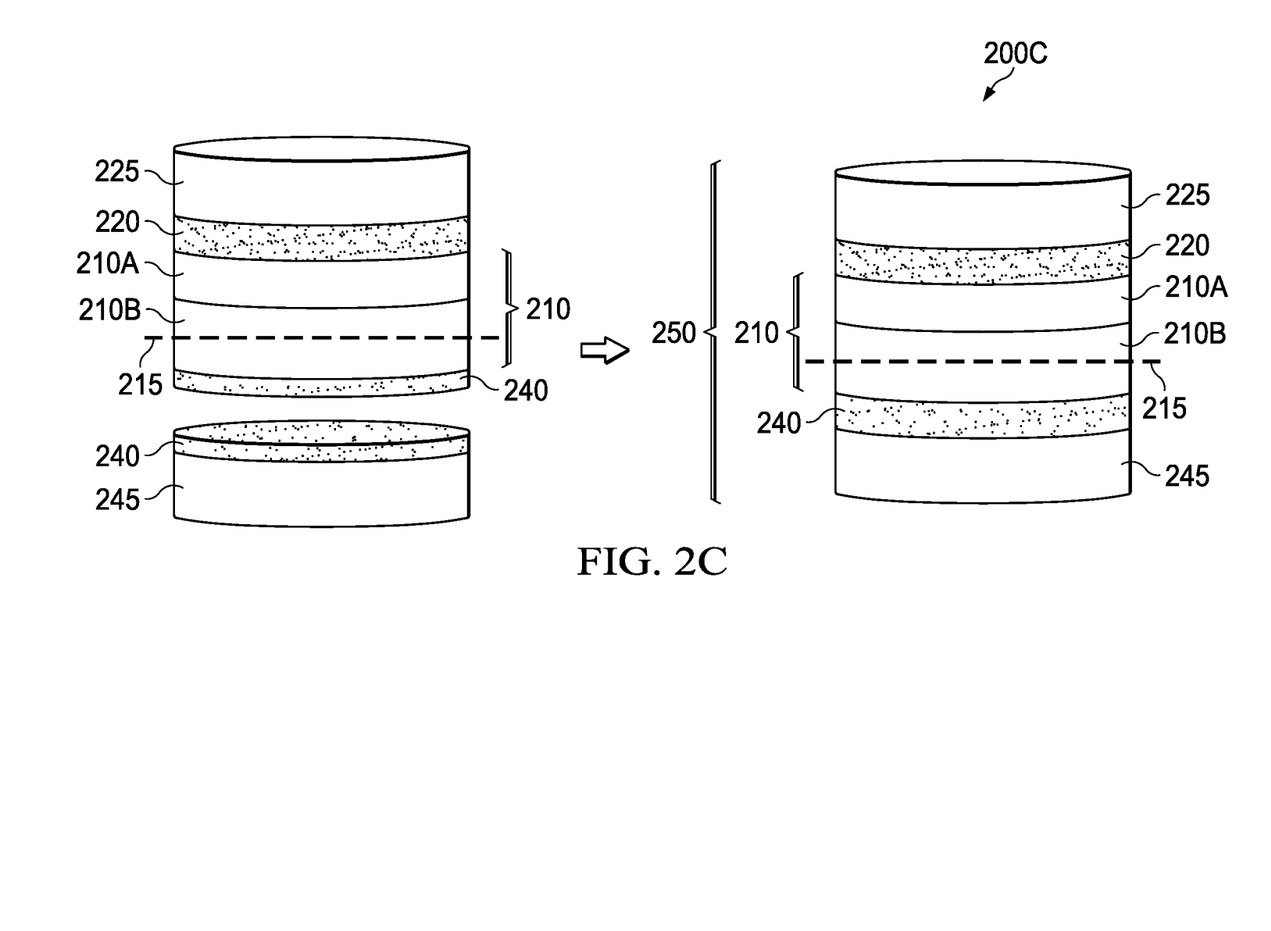

In a second step 200B shown in FIG. 2B and step 530 of process 500, ions 215 are implanted in the epitaxial layer 210B at a position chosen based on the desired thickness of the epitaxial layer 210 on the resulting product. For example, hydrogen ions may be implanted one half μm beneath a surface of the epitaxial layer 210B. FIG. 2C illustrates a third step 200C, in which a layer 240 of a bonding agent is applied to the surface of the epitaxial layer 210B and/or the surface of a product wafer 245. The material of the product wafer 245 can be the same or different from the material of the seed wafer 225 in the seed wafer 235, and can be an insulating substrate with high thermal conductivity and a thermal expansion match to AlGaN epitaxial layers. In some examples, the product wafer 245 is a p-AlN wafer.

The bonding layer 240 can be the same or a different bonding agent as bonding layer 220 in seed wafer 235. At step 540 of process 500, the product wafer 245 is then bonded to the epitaxial layer 210B by bonding layer 240 to obtain a single stage 250 including the seed wafer 225, the bonding layer 220, the epitaxial layers 210A and 210B, the implanted ions 215, the bonding layer 240, and the product wafer 245. In step 200D illustrated in FIG. 2D and step 550 of process 500, the stage 250 is annealed such that the epitaxial layer 210B splits at the position of the implanted ions 215 to obtain two stages—a product stage 255 and a seed wafer stage 260.

Figure 2D:
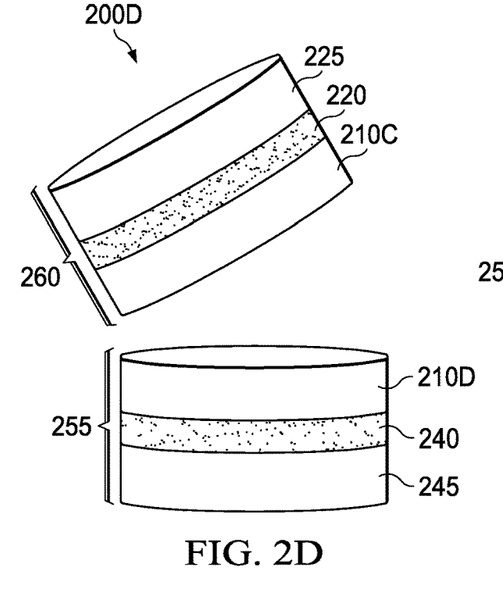

The seed wafer stage 260 includes the seed wafer 225, the bonding layer 220, and a partial epitaxial layer 210C. The surface of the partial epitaxial layer 210C undergoes CMP at step 590 of process 500, and seed wafer stage 260 may be reused as a seed wafer 235 in subsequent performances of the process 200. The product stage 255 includes the product wafer 245, the bonding layer 240, and the partial epitaxial layer 210D. In the example in which the hydrogen ions 215 are implanted one half μm beneath the surface of the epitaxial layer 2106, the partial epitaxial layer 210D is one half μm thick.

In some implementations in which the epitaxial layer 210 is AlGaN, the partial epitaxial layer 210D may be gallium-facing, and the partial epitaxial layer 210C may be nitrogen-facing. The surface of the partial epitaxial layer 210D of the product stage 255 undergoes CMP at step 560 of process 500, such that the partial epitaxial layer 210D is one half μm thick minus an amount removed during CMP for planarization in the previous example. In step 200E illustrated in FIG. 2E and step 570 of process 500, one or more additional epitaxial layers 270 are deposited on the surface of the partial epitaxial layer 210D to form the resulting product. The material in the epitaxial layer 270 may be a doped or undoped GaN material or another appropriate material.

Figure 2E:
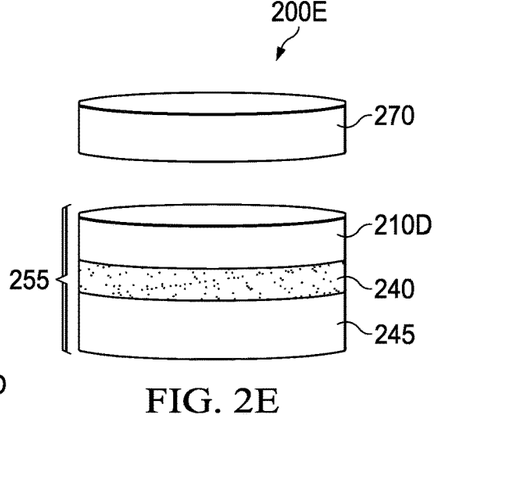

The thickness and material of the epitaxial layer 270 can be chosen based on the particular specifications for the resulting product, such as a depletion-mode GaN device or an enhancement-mode GaN high electron mobility transistor. Many product devices include high electron mobility transistors, which use a combination of AlGaN, AlN, and doped and undoped GaN for the epitaxial layer 270. In addition, some product devices include multiple additional epitaxial layers 270 and a corresponding number of epitaxial deposition steps. For example, a one half μm unintentionally doped (UID) GaN epitaxial layer 270 may be deposited on the surface of the partial epitaxial layer 210D.

The process 200 described in FIGS. 2A-E reduces the number of bonding and debonding steps compared to some conventional processes for device fabrication and uses a thinner epitaxial layer 210 compared to some conventional processes, reducing the time required to deposit the epitaxial layer 210. Although a thinner epitaxial layer reduces the time required to deposit the epitaxial layer, the time required to prepare the wafer for deposition and after the deposition remains the same.

Figure 3A:
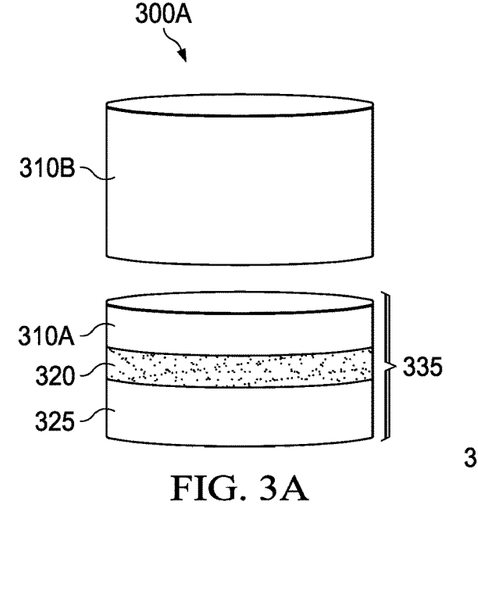
FIGS. 3A-I illustrate a further example gallium nitride epitaxy process using the seed wafer shown in FIGS. 1A-E.

FIGS. 3A-J illustrate an example gallium nitride epitaxy process 300 for fabricating multiple devices using the seed wafer 135 shown in FIGS. 1A-E. The process 300 is similar to the process 200 but enables fabrication of multiple product wafers from a single epitaxial seed deposition, which reduces the total epitaxial processing time per product wafer. For ease of illustration, FIGS. 3A-J are described herein with reference to the example process 500 shown in FIG. 5 for fabricating a product wafer. FIG. 3A illustrates a first step 300A in the process 300 and step 510 of process 500, in which an epitaxial layer 310B of an AlGaN material is deposited on the seed wafer 335. The seed wafer 335 is similar to the seed wafer 135 shown in FIG. 1E and includes the seed wafer substrate 325, the bonding layer 320, and the partial epitaxial layer 310A.

The AlGaN material in epitaxial layer 3108 can be the same as the AlGaN material in epitaxial layer 310A of the seed wafer 335. The thickness of the epitaxial layer 3108 can be chosen based on the particular specification for the resulting products and a number of products to be created from the epitaxial layer 310B and may range from 1 to 20 μm, for example. For example, the resulting products require approximately 0.4 μm of the epitaxial layer 3108, and ten products are to be created from the epitaxial layer 3108. A 5 μm AlGaN epitaxial layer 310B may be deposited on a nitride-facing AlGaN epitaxial layer 310A. The time spent in preparing and depositing the epitaxial layer 3108 is spread across the number of products to be fabricated from the process 300. The surface of the epitaxial layer 310B undergoes CMP at step 520 of process 500.

Figure 3B:
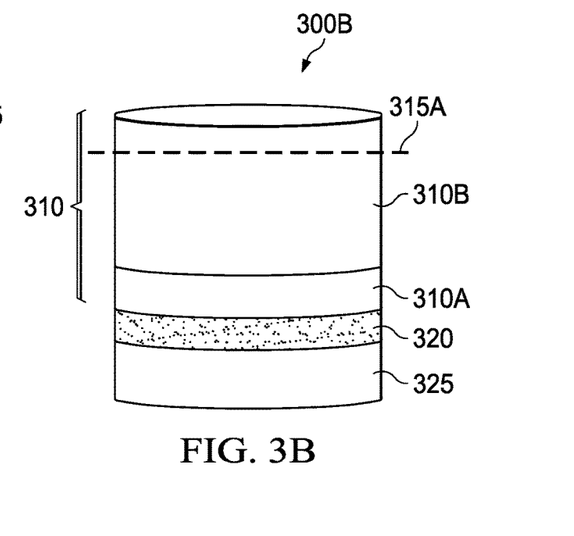
Figure 3C:
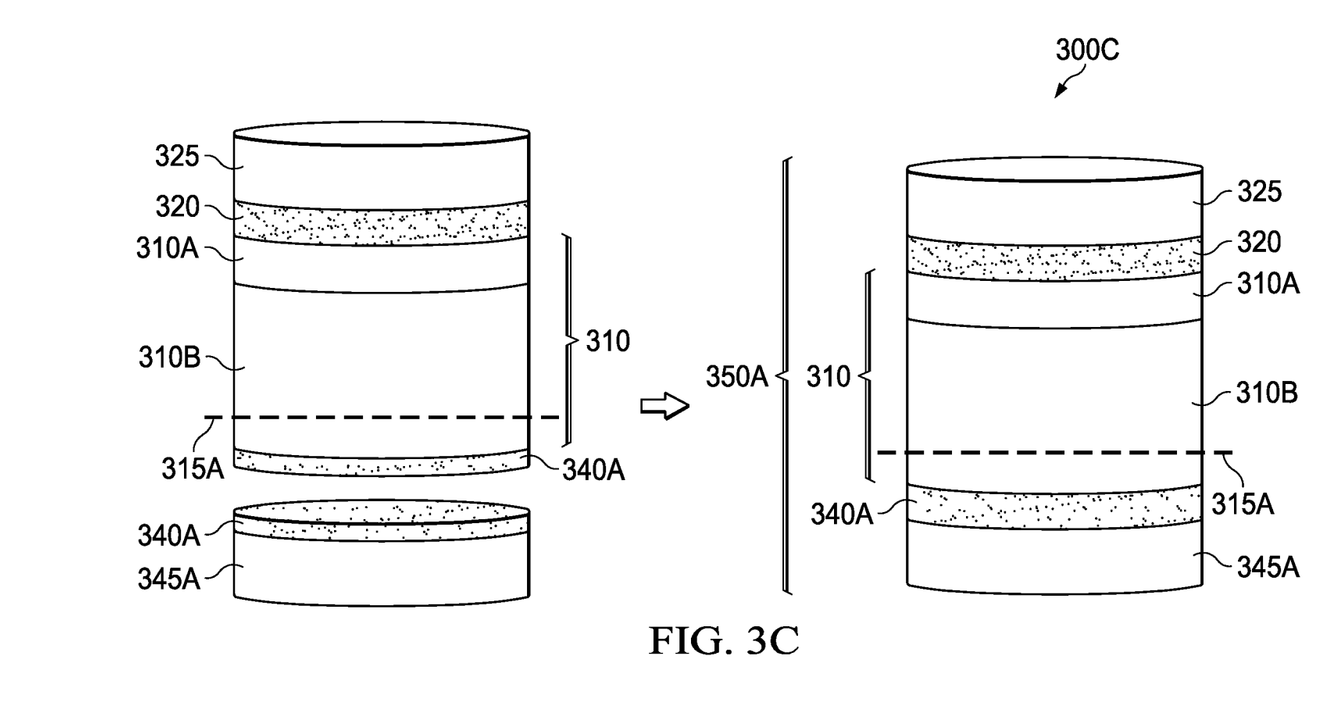

In a second step 300B shown in FIG. 3B and step 530 of process 500, ions 315A are implanted in the epitaxial layer 310B at a position chosen based on the desired thickness of the epitaxial layer 310 on the resulting product. For example, hydrogen ions may be implanted 0.4 μm beneath a surface of the epitaxial layer 310B. FIG. 3C illustrates a third step 300C, in which a layer 340A of a bonding agent is applied to the surface of the epitaxial layer 310B and/or the surface of a product wafer 345A. The material of the product wafer 345A can be the same or a different composition from the material of the seed wafer substrate 325 in the seed wafer 335, and can be an insulating substrate with high thermal conductivity and a thermal expansion match to AlGaN epitaxial layers. In some examples, the product wafer 345A is a p-AlN wafer. The bonding layer 340A can be the same or a different bonding agent as bonding layer 320 in seed wafer 335. At step 540 of process 500, the product wafer 345A is then bonded to the epitaxial layer 310B by bonding layer 340A to obtain a single stage 350A including the seed wafer 325, the bonding layer 320, the epitaxial layers 310A and 310B, the implanted ions 315A, the bonding layer 340A, and the product wafer 345A.

Figure 3D:
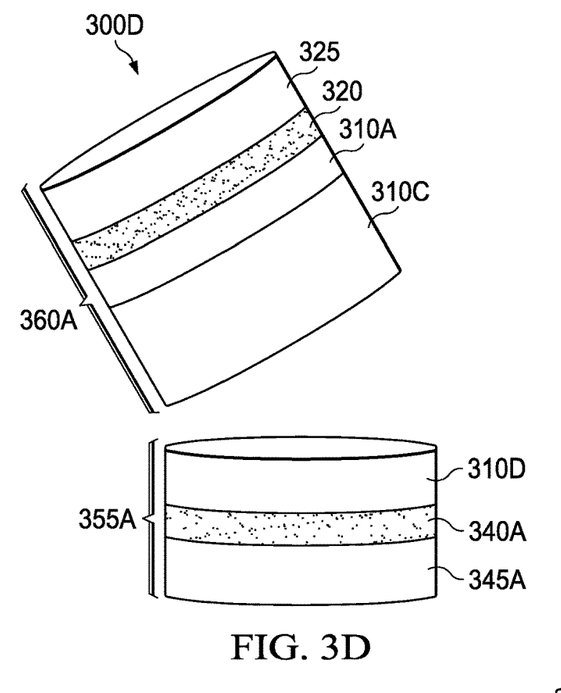

In step 300D illustrated in FIG. 3D and step 550 of process 500, the stage 350A is annealed such that the epitaxial layer 310B splits at the position of the implanted ions 315A to obtain two stages—a product stage 355A and a seed wafer stage 360A. The seed wafer stage 360A includes the seed wafer 325, the bonding layer 320, the epitaxial layer 310A, and a partial epitaxial layer 310C. The product stage 355A includes the product wafer 345A, the bonding layer 340A, and the partial epitaxial layer 310D. In some implementations in which the epitaxial layer 310 is AlGaN, the partial epitaxial layer 310D on the product stage 355A may be gallium-facing, and the partial epitaxial layer 310C on the seed wafer stage 360A may be nitrogen-facing.

The surface of the partial epitaxial layer 310C on the seed wafer stage 360A undergoes CMP at step 590 of process 500. While the remaining epitaxial layer 310C is greater than a threshold thickness as determined at step 580, the remaining epitaxial layer 310C and seed wafer stage 360A are reused as a seed wafer 335 in subsequent performances of the steps 300B and 300C as discussed further herein with respect to FIGS. 3F and 3G to fabricate additional product stages 355. In the example in which the epitaxial layer 310B is 5 μm thick and the hydrogen ions 315A are implanted 0.4 μm beneath the surface of the epitaxial layer 310B, the partial epitaxial layer 310D on the product stage 355A is 0.4 μm thick, and the partial epitaxial layer 310C on the seed wafer stage 360A is approximately 4.6 μm thick. Approximately 0.1 μm of the partial epitaxial layer 310C is removed during CMP, and the remaining 4.5 μm of the partial epitaxial layer 310C on the seed wafer stage 360A can be used to fabricate the remaining nine products.

Figure 3E:
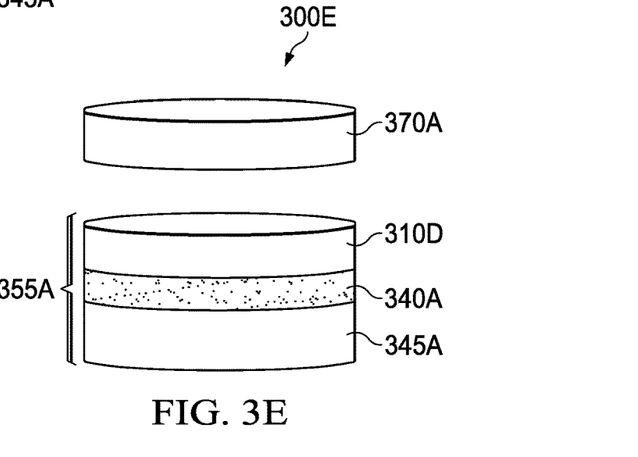

The surface of the partial epitaxial layer 310D of the product stage 355A undergoes CMP at step 560 of process 500, and in step 300E illustrated in FIG. 3E and step 570 of process 500, one or more additional epitaxial layers 370A are deposited on the surface of the partial epitaxial layer 310D to form the resulting product. Many product devices include high electron mobility transistors, which use a combination of AlGaN, AlN, and doped and undoped GaN for the epitaxial layer 370A. In addition, some product devices include multiple additional epitaxial layers 370A and a corresponding number of epitaxial deposition steps. The thickness of the epitaxial layer 370A can be chosen based on the particular specifications for the resulting product. For example, a one half μm unintentionally doped (UID) GaN epitaxial layer 370A may be deposited on the surface of the partial epitaxial layer 310D.

Figure 3F:
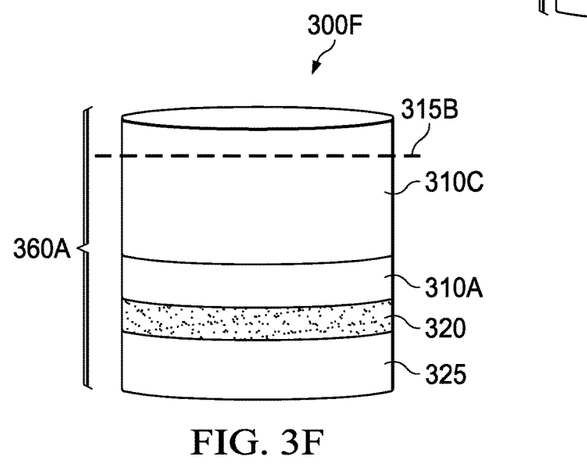

Step 300F shown in FIG. 3F is similar to step 300B shown in FIG. 3B and step 530 of process 500, and the seed wafer stage 360A is reused in the fabrication of a second product. Ions 315B are implanted in the epitaxial layer 310C at a position chosen based on the desired thickness of the epitaxial layer 310 on the resulting product. For example, hydrogen ions may be implanted 0.4 μm beneath a surface of the epitaxial layer 310C. The ions 315B can be the same as or different than the ions 315A, and implanted at a same or different depth beneath the surface of the epitaxial layer 310 as ions 315A.

Figure 3G:
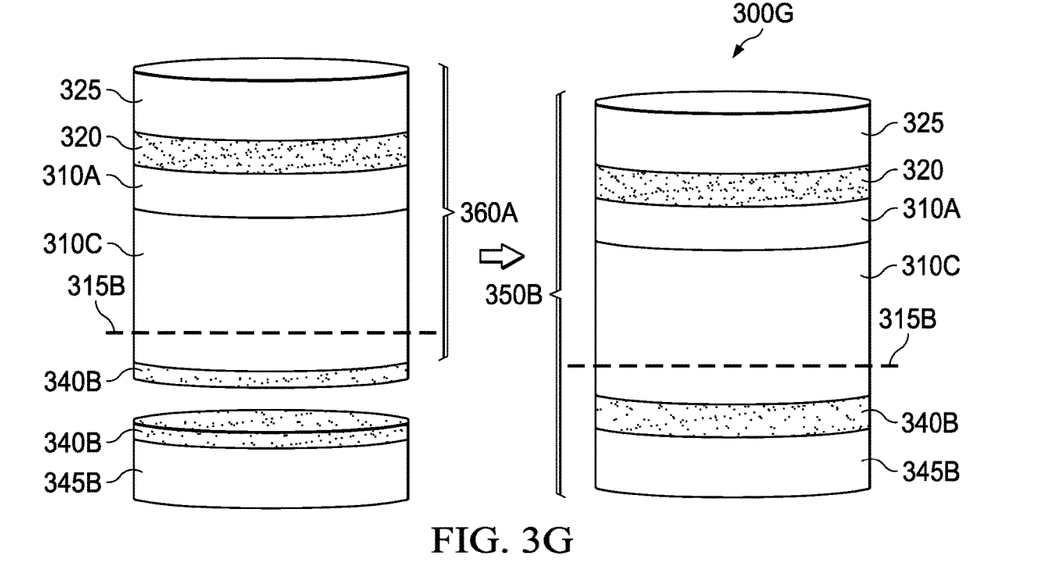

Step 300G shown in FIG. 3G is similar to step 300C shown in FIG. 3C, and a layer 340B of a bonding agent is applied to the surface of the epitaxial layer 310C and/or the surface of a product wafer 345B. The material of the product wafer 345B can be the same as the material of the product wafer 345A or the seed wafer substrate 325 in the seed wafer 335. In some examples, the product wafer 345B is a p-AlN wafer. The bonding layer 340B can be the same or a different bonding agent as bonding layer 340A or bonding layer 320 in seed wafer 335. At step 540 of process 500, the product wafer 345B is then bonded to the epitaxial layer 310C by bonding layer 340B to obtain a single stage 350B including the seed wafer 325, the bonding layer 320, the epitaxial layers 310A and 310C, the implanted ions 315B, the bonding layer 340B, and the product wafer 345B.

Figures 3H, 3I:
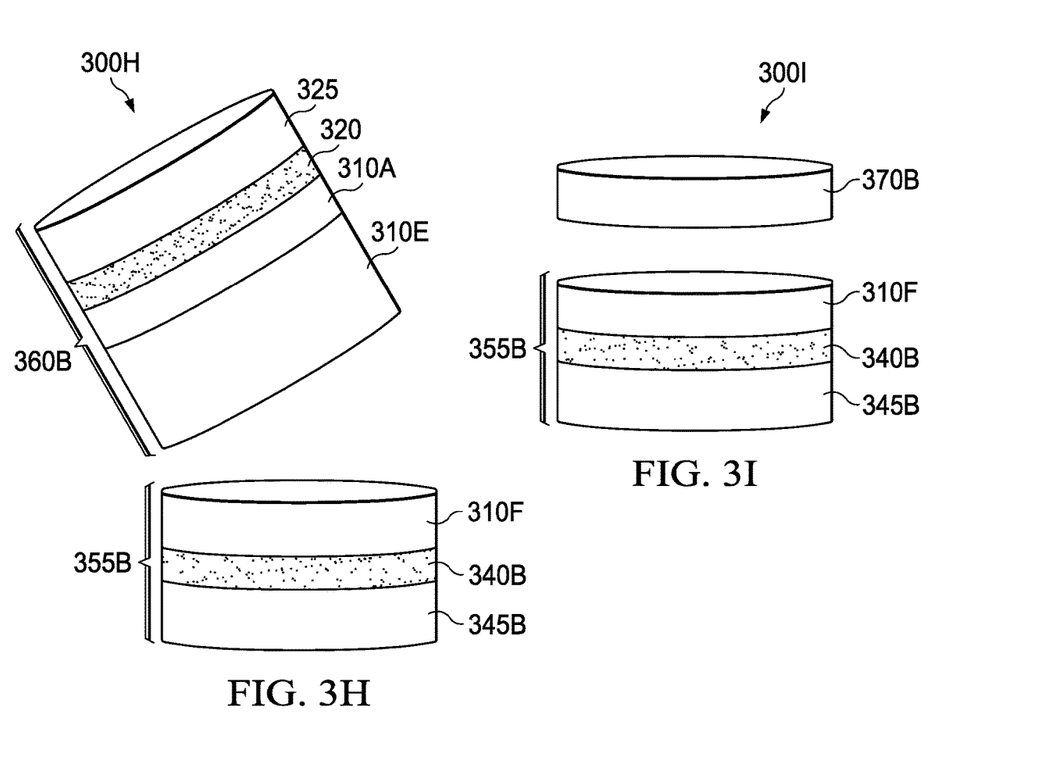

Step 300H shown in FIG. 3H is similar to step 300D shown in FIG. 3D and step 550 of process 500, and the stage 350B is annealed such that the epitaxial layer 310C splits at the position of the implanted ions 315B to obtain two stages—a product stage 355B and a seed wafer stage 360B. The seed wafer stage 360B includes the seed wafer substrate 325, the bonding layer 320, the epitaxial layer 310A, and a partial epitaxial layer 310E. The product stage 355B includes the product wafer 345B, the bonding layer 340B, and the partial epitaxial layer 310F. In some implementations in which the epitaxial layer 310 is AlGaN, the partial epitaxial layer 310F on product stage 355B may be gallium-facing, and the partial epitaxial layer 310E on seed wafer stage 360B may be nitrogen-facing.

The surface of the partial epitaxial layer 310E on seed wafer stage 360B undergoes CMP at step 590 of process 500. While the remaining epitaxial layer 310E is greater than a threshold thickness as determined at step 580, the remaining epitaxial layer 310E and seed wafer stage 360B are reused to fabricate other products. In the example in which the epitaxial layer 310C is 4.6 μm thick and the hydrogen ions 315B are implanted 0.4 μm beneath the surface of the epitaxial layer 310C, the partial epitaxial layer 310F on product stage 355B is 0.4 μm thick, and the partial epitaxial layer 310E on the seed wafer stage 360B is approximately 4.1 μm thick. Approximately 0.1 μm of the partial epitaxial layer 310E is removed during CMP at step 590 of process 500, and the remaining 4 μm of the partial epitaxial layer 310E on the seed wafer stage 360B can be used to fabricate the remaining eight products.

The surface of the partial epitaxial layer 310F of the product stage 355B undergoes CMP at step 560 of process 500, and step 300I illustrated in FIG. 3I is similar to step 300E illustrated in FIG. 3E and step 570 of process 500. One or more additional epitaxial layers 370B are deposited on the surface of the partial epitaxial layer 310F to form the resulting product. The material in the epitaxial layer 370B may be a doped or undoped GaN material or another appropriate material. The thickness of the epitaxial layer 370B can be chosen based on the particular specifications for the resulting product. For example, a one half μm unintentionally doped (UID) GaN epitaxial layer 370B may be deposited on the surface of the partial epitaxial layer 310F.

The process 300 described in FIGS. 3A-I reduces the number of bonding and debonding steps compared to some conventional processes for product fabrication and reuses a single seed wafer with an epitaxial deposition for several products, to spread the time spent in preparing and depositing the epitaxial layer across the several products.

Unless otherwise stated, "about," "approximately," or "substantially" preceding a value means+/−10 percent of the stated value. Modifications are possible in the described examples, and other examples are possible within the scope of the claims.

Modifications are possible in the described embodiments, and other embodiments are possible, within the scope of the claims.

What is claimed is:
1. A method, comprising:
   forming a first epitaxial layer of a gallium nitride (GaN) material onto a first substrate;
   bonding a surface of the first epitaxial layer to a second substrate, the second substrate including an insulating material;

splitting the first epitaxial layer into a second epitaxial layer on the first substrate and a third epitaxial layer on the second substrate;

forming a first wafer including the third epitaxial layer on the second substrate; and forming a second wafer having a third substrate using the first wafer.

2. The method of claim 1, wherein the gallium nitride material is an aluminum gallium nitride (AlGaN) material, and the first substrate reduces a dislocation density of the first epitaxial layer.

3. The method of claim 1, further comprising providing ions at a depth beneath a surface of the first epitaxial layer, wherein the depth beneath the surface of the first epitaxial layer is based on a thickness of the third epitaxial layer.

4. The method of claim 1, further comprising removing the second epitaxial layer from the first substrate.

5. The method of claim 1, wherein the first substrate includes sapphire.

6. The method of claim 1, wherein the surface of the first epitaxial layer is gallium facing and a surface of the third epitaxial layer is nitride facing.

7. The method of claim 1, wherein the second substrate includes aluminum nitride.

8. The method of claim 1, wherein the GaN material is a first GaN material, and forming a second wafer having a third substrate using the first wafer includes:

forming a fourth epitaxial layer of a second GaN material onto a surface of the third epitaxial layer of the first wafer;

providing ions at a depth beneath a surface of the fourth epitaxial layer;

bonding the surface of the fourth epitaxial layer to the third substrate, the third substrate including the insulating material;

splitting the fourth epitaxial layer into a fifth epitaxial layer on the second substrate and a sixth epitaxial layer on the third substrate; and forming a seventh epitaxial layer of a third GaN material onto a surface of the sixth epitaxial layer on the third substrate to form the second wafer.

9. The method of claim 8, wherein the third substrate includes a same material as the second substrate.

10. The method of claim 8, wherein the depth beneath the surface of the fourth epitaxial layer is based on a thickness of the sixth epitaxial layer.

11. The method of claim 8, wherein the surface of the third epitaxial layer is nitride facing and the surface of the sixth epitaxial layer is gallium facing.

12. The method of claim 8, wherein the third substrate includes aluminum nitride.

13. The method of claim 8, further comprising: forming a plurality of GaN devices using the fourth epitaxial layer.

14. The method of claim 13, further comprising:

providing ions at a depth beneath a surface of the fifth epitaxial layer;

bonding the surface of the fifth epitaxial layer to a fourth substrate, the fourth substrate including the insulating material;

splitting the fifth epitaxial layer into an eighth epitaxial layer on the second substrate and a ninth epitaxial layer on the fourth substrate; and forming a tenth epitaxial layer of a fourth GaN material onto a surface of the ninth epitaxial layer on the fourth substrate to form a third wafer.

15. A method, comprising:

forming a first epitaxial layer onto a base epitaxial layer of a first substrate;

providing ions at a depth beneath a surface of the first epitaxial layer;

bonding the surface of the first epitaxial layer to a second substrate, the second substrate including an insulating material;

splitting the first epitaxial layer into a second epitaxial layer on the first substrate and a third epitaxial layer on the second substrate;

forming a fourth epitaxial layer of a second material onto a surface of the third epitaxial layer on the second substrate to obtain a wafer; and forming devices in the fourth epitaxial layer of the wafer.

16. The method of claim 15, wherein the depth beneath the surface of the first epitaxial layer is based on a thickness of the third epitaxial layer.

17. The method of claim 15, wherein the first and second substrates include aluminum nitride.

18. The method of claim 15, further comprising forming a plurality of devices using the first epitaxial layer.

19. The method of claim 18, further comprising:

providing ions at a depth beneath a surface of the second epitaxial layer;

bonding the surface of the second epitaxial layer to a third substrate, the third substrate including the insulating material;

splitting the second epitaxial layer into a fifth epitaxial layer on the first substrate and a sixth epitaxial layer on the third substrate; and forming a seventh epitaxial layer onto a surface of the sixth epitaxial layer on the third substrate.

20. A method, comprising:

forming a first substrate and a base epitaxial layer on the first substrate;

forming a first epitaxial layer over the base epitaxial layer; and providing ions at a depth beneath a surface of the first epitaxial layer;

bonding the surface of the first epitaxial layer to a second substrate, the second substrate including an insulating material;

splitting the first epitaxial layer at the depth beneath the surface of the first epitaxial layer to form a second epitaxial layer bonded to the second substrate; and forming a third epitaxial layer on a surface of the second epitaxial layer to form a wafer including the second substrate.

21. The method of claim 20, wherein forming a first substrate and a base epitaxial layer on the first substrate includes:

forming a third epitaxial layer on a third substrate;

providing ions at a depth beneath a surface of the third epitaxial layer;

bonding the surface of the third epitaxial layer to the first substrate; and splitting the third epitaxial layer to form the base epitaxial layer bonded to the first substrate.

22. The method of claim 20, wherein the base epitaxial layer, the first epitaxial layer, and the second epitaxial layer each includes a respective GaN material.

23. The method of claim 20, wherein the first substrate includes the insulating material.

24. The method of claim 23, wherein the insulating material includes aluminum nitride.

25. The method of claim 15, wherein the first epitaxial layer and the base epitaxial layer are of an AlGaN material.

26. The method of claim 15, wherein providing ions at a depth beneath a surface of the first epitaxial layer includes implanting the ions at the depth.

27. The method of claim 15, wherein splitting the first epitaxial layer into a second epitaxial layer on the first substrate and a third epitaxial layer on the second substrate includes annealing the first epitaxial layer.

28. The method of claim 1, wherein providing ions at a depth beneath a surface of the first epitaxial layer includes implanting the ions at the depth.

29. The method of claim 1, wherein splitting the first epitaxial layer into a second epitaxial layer on the first substrate and a third epitaxial layer on the second substrate includes annealing the first epitaxial layer.

30. The method of claim 1, further comprising polishing the surface of the first epitaxial layer and polishing a surface of the third epitaxial layer.

31. The method of claim 1, further comprising forming devices on the second wafer.

32. The method of claim 15, further comprising forming devices on the wafer.

33. The method of claim 20, further comprising forming devices on the wafer.

* * * * *